United States Patent [19]
Jung

[11] Patent Number: 6,128,235
[45] Date of Patent: Oct. 3, 2000

[54] METHOD FOR CONTROLLING SENSING AMPLIFIER DRIVER

[75] Inventor: Woong Sik Jung, Seoul, Rep. of Korea

[73] Assignee: Hyundai Electronics Industries Co., Ltd., Ichon, Rep. of Korea

[21] Appl. No.: 09/374,764

[22] Filed: Aug. 16, 1999

[30] Foreign Application Priority Data

Aug. 18, 1998 [KR] Rep. of Korea ................. 98-33510

[51] Int. Cl.⁷ ................................................. G11C 7/00
[52] U.S. Cl. ..................... 365/205; 365/189.11; 365/207
[58] Field of Search ................................ 365/207, 190, 365/205, 203, 189.11

[56] References Cited

U.S. PATENT DOCUMENTS

| | | | |
|---|---|---|---|
| 5,555,523 | 9/1996 | Haga et al. | 365/203 |
| 5,673,226 | 9/1997 | Yumitori et al. | 365/190 |
| 5,706,229 | 1/1998 | Yabe et al. | 365/205 |
| 5,852,584 | 12/1998 | Arai | 365/205 |
| 6,028,800 | 2/2000 | Akiba et al. | 365/205 |

*Primary Examiner*—Tan T. Nguyen
*Attorney, Agent, or Firm*—Fleshner & Kim, LLP

[57] ABSTRACT

A method for controlling a sense amplifier driver results in a fast speed memory device. Instead of using an overdrive structure, an efficient use of a block selection signal provide a driving voltage for access of a first data in a memory device at a fast speed and a low power consumption.

4 Claims, 6 Drawing Sheets

METHOD FOR CONTROLLING SENSING AMPLIFIER DRIVER

BACKGROUND OF THE INVENTION

1. Field of the Invention

The present invention relates to a memory device, and more particularly, a method for controlling a sense amplifier driver of a memory device.

2. Background of the Related Art

A sense amplifier detects a voltage or current level of an input signal as a threshold value and amplifies the input signal. The sense amplifier may also detect only an input signal of a specific temporal area. The sense amplifier serves to accurately sense and amplify data stored in a memory, and then transfer the amplified value to other circuits. For integrated circuits, the sense amplifier requires high sensitivity, high speed operation, wide operation range of power source voltage, low power consumption and small area layout.

FIG. 1 is a block diagram of a related art memory device using a sense amplifier. As shown in FIG. 1, the related art memory device includes an address generator 10 for generating addresses, and a pre-decoder 20 for decoding the addresses generated by the address generator 10. A word/bit line decoder 30 decodes and selects corresponding word line and bit line based on an address decoding signal generated by the pre-decoder 20. A memory cell in a memory array 40 is accessed based on the selected word line WL driven by the word/bit line decoder 30.

Since the data sensing speed of the sensing amplifier 50 serves to determine access speed of the memory device, a sense amplifier driver is provided per sense amplifier or more to increase the data sensing speed. A sense amplifier 50 receives data accessed from the selected memory cell of the array 40 through the bit line BL and amplifies the data. An output latch 60 latches a signal provided from the sense amplifier 50 in response to an address transition detecting (ATD) signal generated by the address generator 10.

FIG. 2 is a circuit diagram of the related sense amplifier driver. A first PMOS transistor P10 includes a drain terminal connected to a supply terminal of a pull-up control signal SPC of the sense amplifier and a source terminal receiving an external voltage, and is turned on/off by a first driving signal SP1 provided at a gate terminal. A second PMOS transistor P11 includes a drain terminal connected to the drain terminal of the first PMOS transistor P10 and a source terminal receiving an internal voltage, and is turned on/off by a second driving signal SP2 provided at a gate terminal.

A first NMOS transistor N12 includes a drain terminal connected to a supply terminal of a pull-down control signal SNC of the sense amplifier and a source terminal connected to a ground terminal, and is turned on/off by a third driving signal SN1 provided at a gate terminal. A second NMOS transistor N13 includes a drain terminal connected to the drain terminal of the first NMOS transistor N12 and the source terminal connected to the ground terminal, and is turned on/off by a fourth driving signal SN2 provided at a gate terminal. A bit line equalizer circuit (BLEQ) 100 is turned on by a bit line equalizer signal BLEQ provided to equalize levels of the pull-up control signal SPC and the pull-down control signal SNC when the sense amplifier is not operated, and electrically connects the pull-up control signal SPC with the pull-down control signal SNC.

FIG. 3 is a circuit diagram of a related sense amplifier, and FIG. 4 shows signal waveforms provided by each element of FIGS. 2 and 3. Referring to FIGS. 3 and 4, to completely transfer data of the memory cell to the sense amplifier before enabling the word line WL, a signal selected among block selection (BS) signals precharged to VDD level ascends to VPP level and a signal not selected among the block selection signals descends to VSS level (See waveforms of BSI/BSJ(Block selection I/Block selection J)).

Thereafter, charge sharing occurs as the word line WL is enabled. To completely develop the sensed data, the bit line BL is completely developed by the pull-up control signal SPC and the pull-down control signal SNC of the sense amplifier.

At this time, if the pull-up control signal SPC is supplied by only the internal voltage, the bit line loading is too large (because BSI/BSJ are VPP level), thereby causing the first developing time to be long. To improve this problem, the related art adopts the external power source as shown in the waveforms WL, SP1 and SP2 of FIG. 4.

In other words, to avoid the extended development time due to large bit line loading, the external voltage, i.e., the SP1 signal is developed together with the internal voltage for a specific pulse width. Thus, overdriving occurs to improve the first developing time. In the waveform diagram, the label SBL/SBLb are the bit lines in the sense amplifier and CBL/CBLb are the bit lines in the cell.

The related art method for controlling the sensing amplifier driver has various problems. For example, the developing time of the first data has been improved using the internal voltage and the external voltage during the first development, as shown in the signal waveform of the SPC. However, overcurrent may flow from the supply terminal of the internal voltage to the supply terminal of the external voltage during a specific pulse width, so that reliability of the sense amplifier is deteriorated. In addition, since the external voltage and the internal voltage are conducted together, a short may occur in a core of the memory device. Further, since an area for applying the external voltage is required, the packing density of the memory device which adopts such a sense amplifier is deteriorated.

SUMMARY OF THE INVENTION

Accordingly, the present invention is directed to obviate at least one or more of the problems, limitations/or and disadvantages of the related art.

An object of the present invention is to improve memory speed.

Another object of the present invention is to reduce power consumption.

An object of the present invention is to provide a method for controlling a sense amplifier driver which controls a fast speed memory device by efficiently using a block selection signal instead of using an overdrive structure without consumption of overcurrent which occurs when the overdrive structure is adopted to provide a driving voltage for access of first data to realize a low power fast speed memory device in a sense amplifier driver.

The present invention can be achieved in parts or in a whole by a method for controlling a sense amplifier driver in which two memory cell blocks are connected to a sense amplifier, for providing the pull-up potential of a corresponding sense amplifier by an internal power source during reading/writing operation of a memory cell disposed in a specific memory cell block, according to the present invention, includes a first step of maintaining a selection signal of the memory cell block having a memory cell corresponding to a corresponding word line among block selection signals precharged to a second potential level at the second potential level and transiting a selection signal of the other memory cell block to a first potential level so as to completely transfer data of the memory cell to the sense amplifier before the word line to activate any memory cell is enabled, a second step of performing sensing operation and charge sharing operation of data of the memory cell by enabling the word line, and a third step of completely developing the bit line by a pull-up control signal and a pull-down control signal of the sense amplifier, wherein the second potential level of the block selection signal is VDD level.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
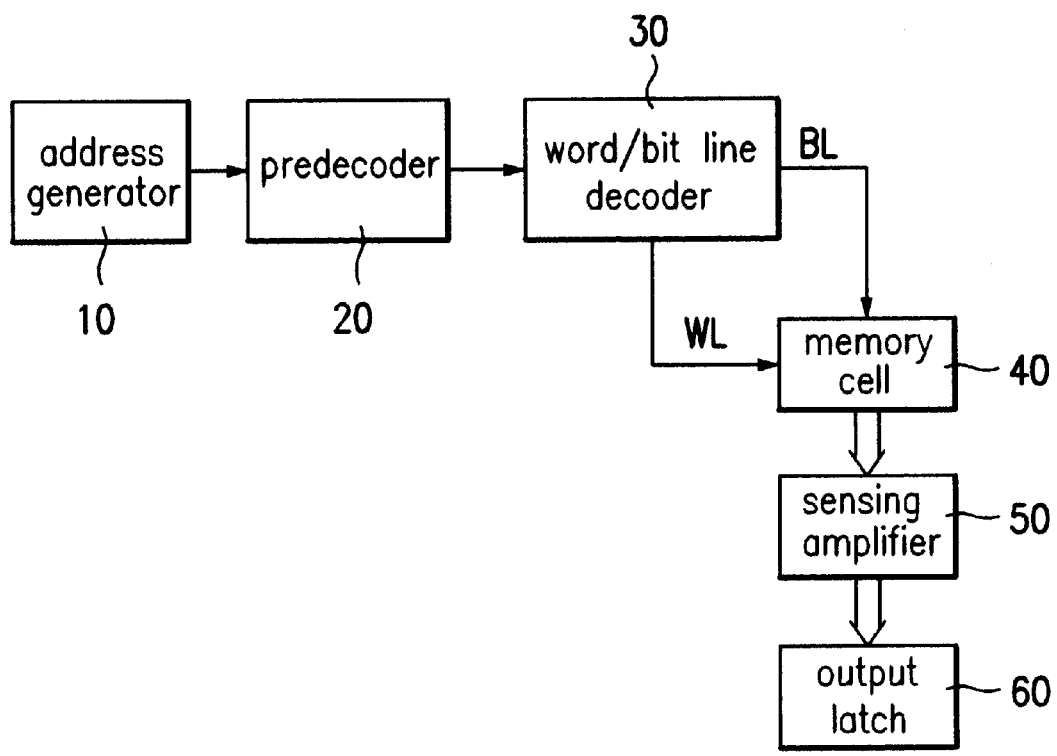
FIG. 1 is a block diagram illustrating a related art memory device.
Figure 2:
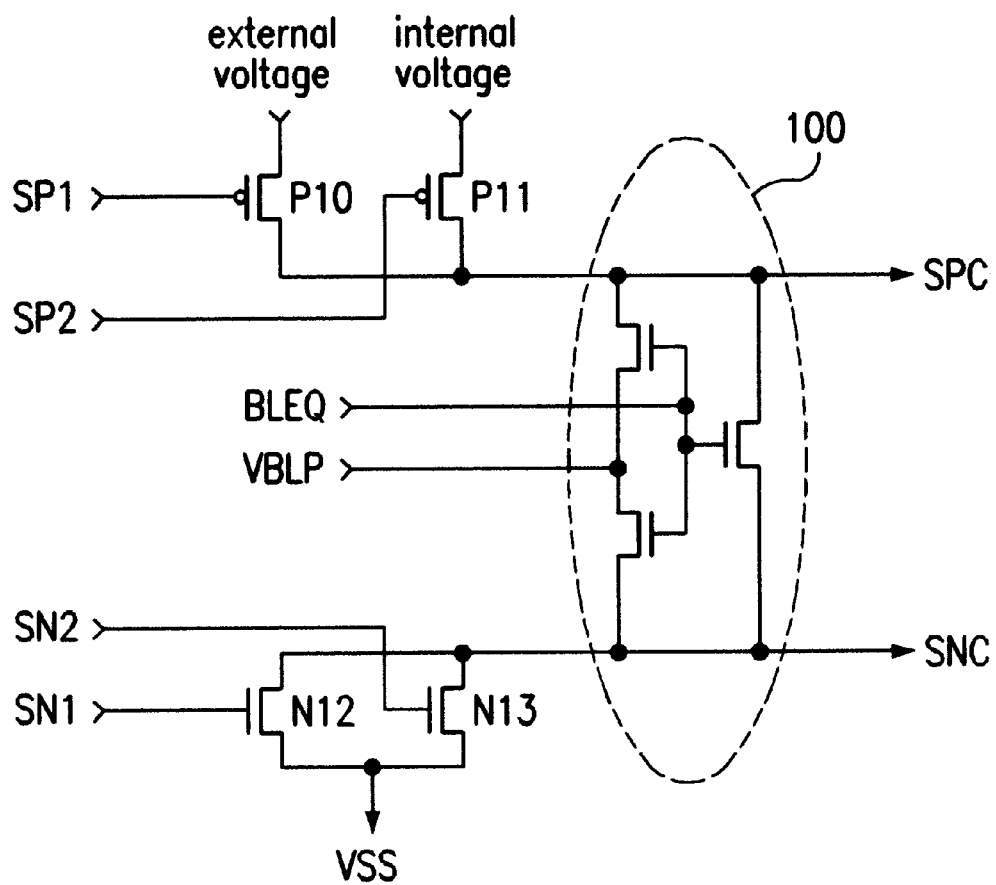
FIG. 2 is a circuit diagram illustrating a related art sense amplifier driver.
Figure 3:
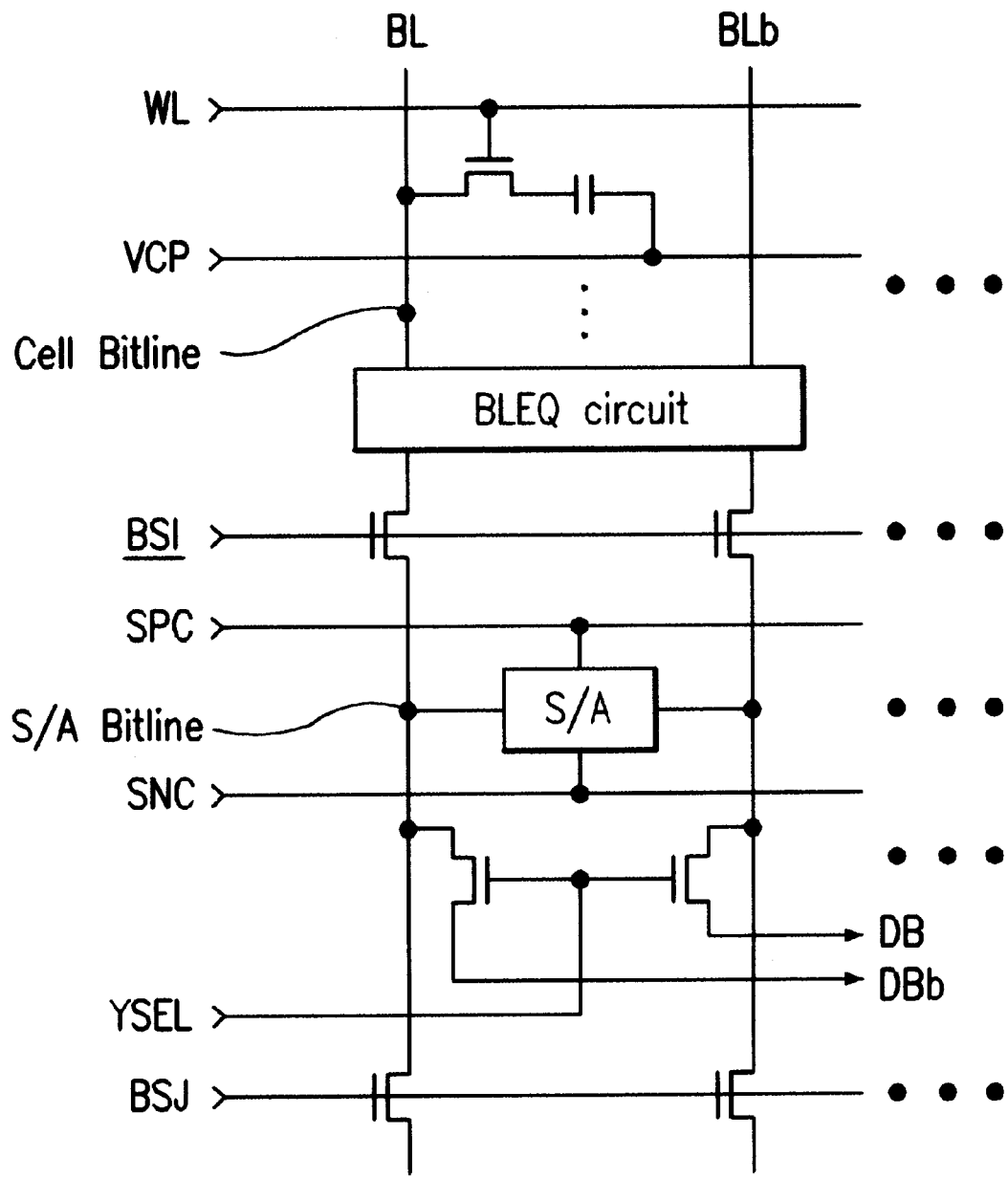
FIG. 3 is a circuit diagram illustrating a sense amplifier.
Figure 4:
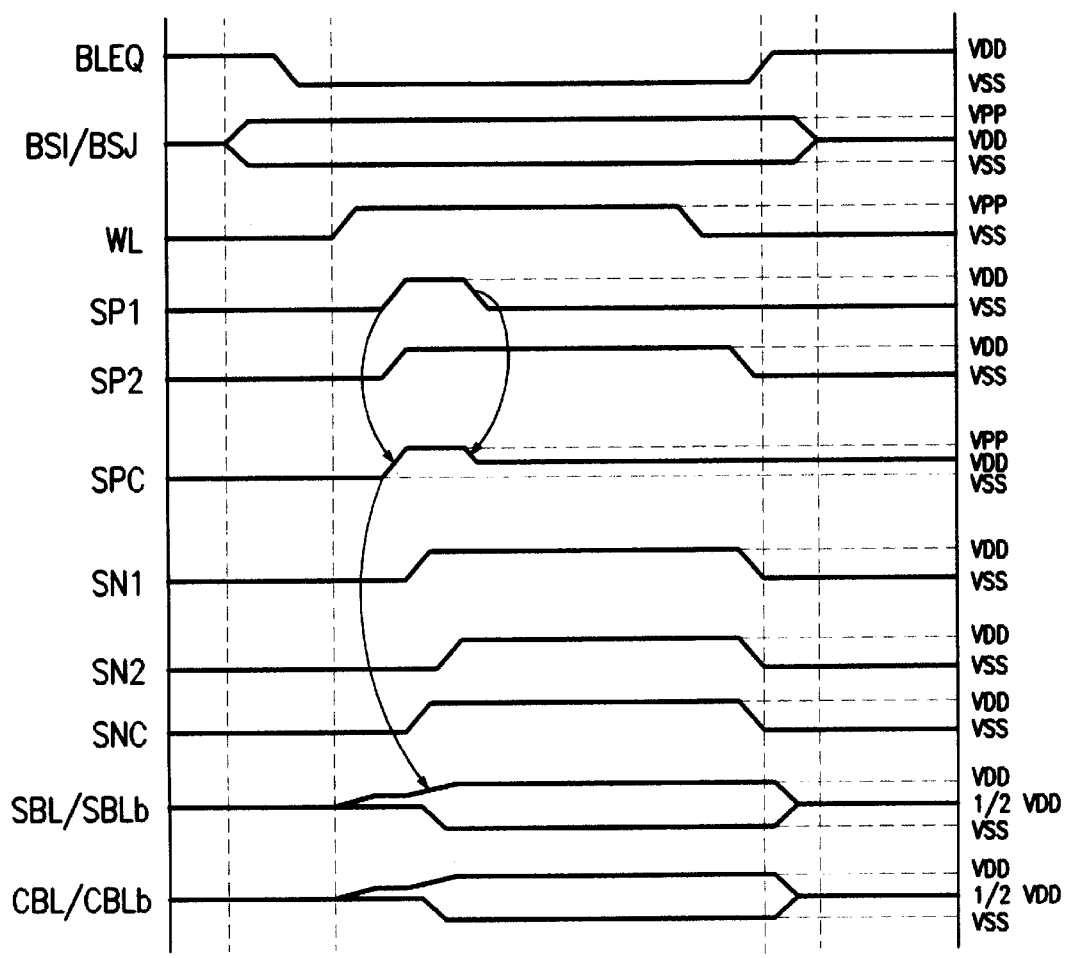
FIG. 4 are waveform diagrams illustrating the signals of FIGS. 2 and 3.
Figure 5:
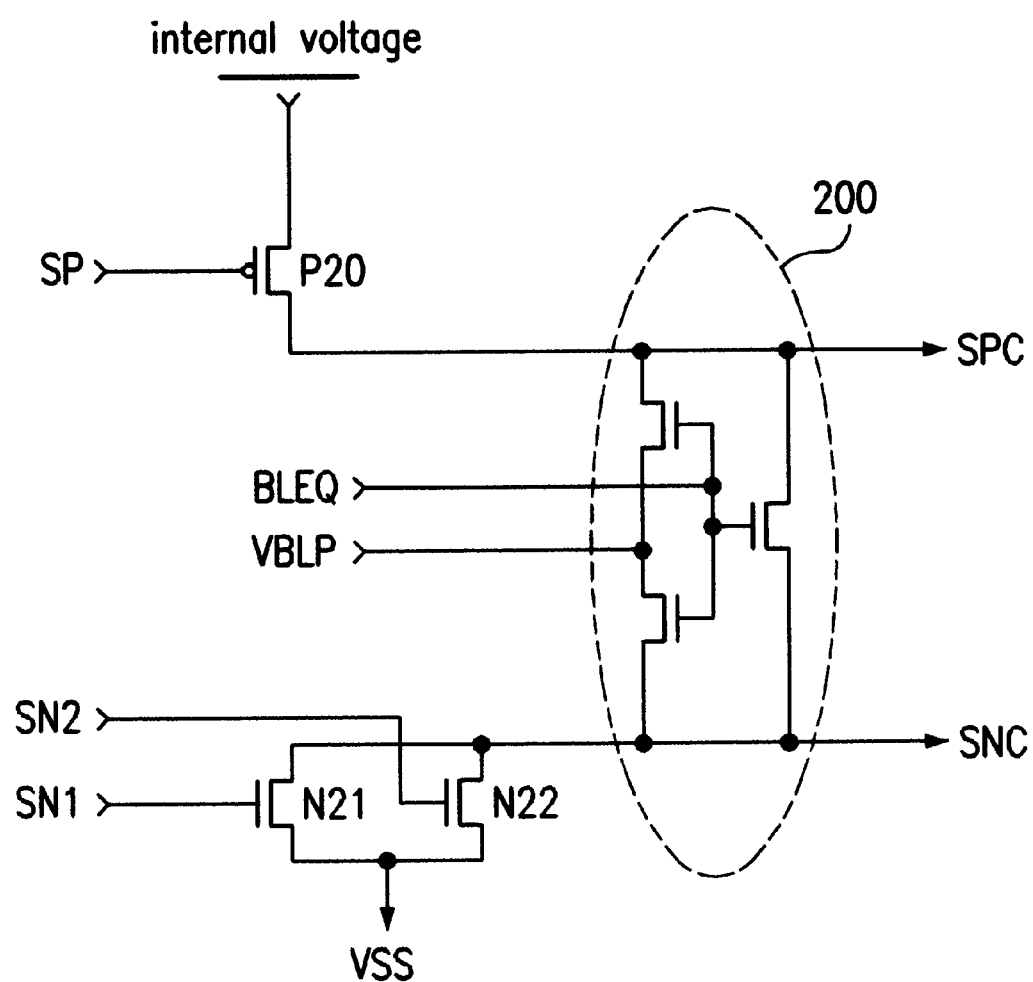
FIG. 5 is a circuit diagram illustrating a sense amplifier driver in accordance with a preferred embodiment of the present invention.

FIG. 5 is a circuit diagram illustrating a sense amplifier driver according to a preferred embodiment of the present invention. A first PMOS transistor P20 has a drain terminal connected to a supply terminal of a pull-up control signal SPC of a sense amplifier and a source terminal receiving an internal voltage, and is turned on/off by a first driving signal SP provided at a gate terminal. A first NMOS transistor N21 has a drain terminal connected to a supply terminal of a pull-down control signal SNC of the sense amplifier and a source terminal connected to a ground terminal, and is turned on/off by a second driving signal SN1 provided at a gate terminal.

A second NMOS transistor N22 has a drain terminal connected to the drain terminal of the first NMOS transistor N21 and a source terminal connected to the ground terminal, and is turned on/off by a third driving signal SN2 provided at a gate terminal. A bit line equalizer circuit 200 is turned on by a bit line equalizer signal BLEQ provided to equalize levels of the pull-up control signal SPC and the pull-down control SNC when the sense amplifier is not operated, for electrically connecting the pull-up control signal SPC with the pull-down control signal SNC.

Figure 6:
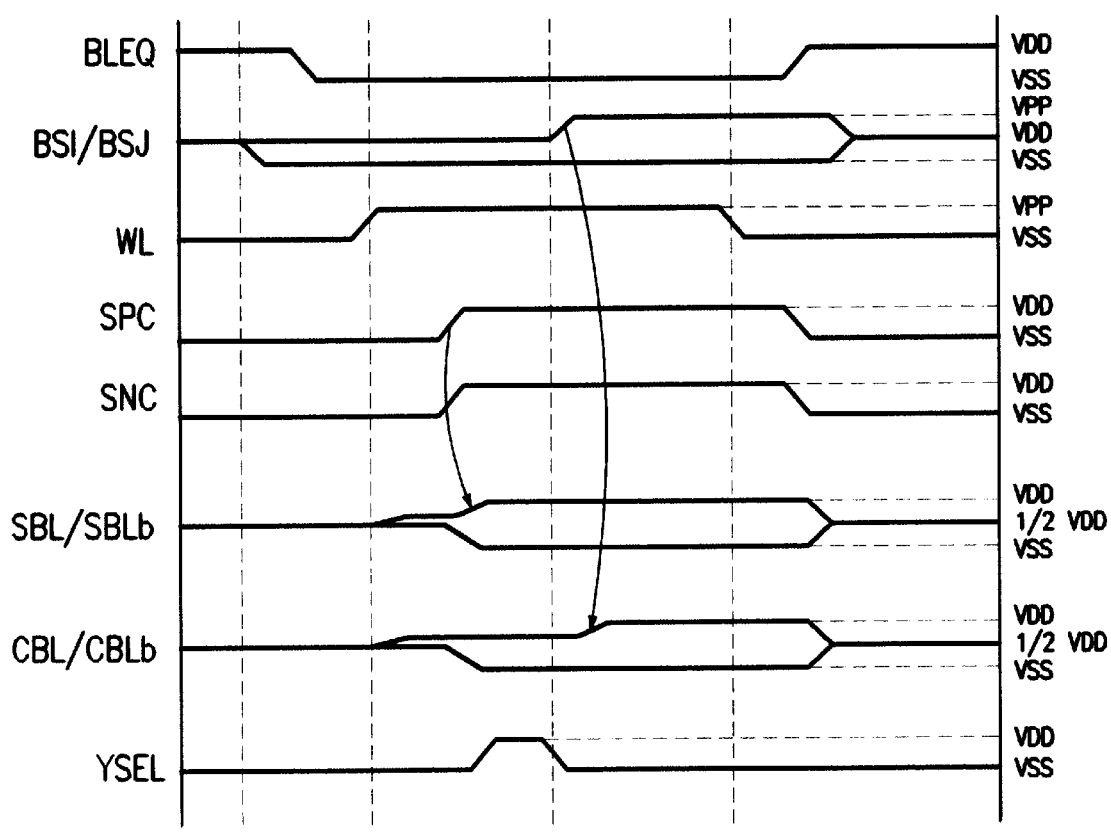
FIG. 6 are waveform diagrams illustrating the signals of FIG. 5.

The operation of the sense amplifier driver according to the present invention will be described with reference to the waveform diagram of FIG. 6. To completely transfer the data of the memory cell to the sense amplifier before the word line WL is enabled, a signal not selected among the block selection (BS) signals precharged to VDD level descends to a VSS level and a signal selected among the block selection signals is maintained at a VDD level. Thereafter, a sensing operation and a charge sharing operation of the data of the memory cell are performed by enabling the word line. To completely develop the sensed data, the bit line BL is completely developed by the pull-up control signal SPC and the pull-down control signal SNC of the sense amplifier.

At this time, even if the pull-up control signal SPC is only supplied by the internal voltage, a cell bit line CBL and a cell bit bar line CBLb are not completely turned on because the block selection signal BS is maintained at a VDD level, not a VPP level. Thus, the bit line loading becomes relatively small and the developing time becomes shorter. Subsequently, before the completion of the data sensing operation, YSEL (Y-selection or column-selection) opens to generate the data, and the block selection BS signal selected from the time when the YSEL is closed to the time when the word line is disabled ascends to a VPP level, so that the cell bit line CBL and the cell bit bar line CBLb are fully restored.

The method for controlling the sense amplifier driver according to the present invention has various advantages. For example, the voltage level of the pull-up control signal is maintained at a specific voltage state only by an internal power source by controlling the level of the block selection signal. In other words, since the internal voltage is only used, an overcurrent due to the external voltage does not occur, unlike the related art method in which the internal voltage and the external voltage are used together. In addition, since the external voltage is not required, a short of the external voltage and the internal voltage does not occur and the packing density of the device can be improved.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A method for controlling a sense amplifier driver in which two memory cell blocks are connected to a sense amplifier, for providing pull-up potential of a corresponding sense amplifier by an internal power source during reading/writing operation of a memory cell disposed in a specific memory cell block, the method comprising the steps:

maintaining a selection signal of the memory cell block having a memory cell corresponding to a corresponding word line among block selection signals precharged to a first potential level which is different from a higher third potential level, and transiting a selection signal of the other memory cell block to a second potential level;

performing at least one of a sensing operation and a charge sharing operation of data of the memory cell by enabling the word line; and developing a bit line by a pull-up control signal and a pull-down control signal of the sense amplifier.

2. The method of claim 1, wherein the first potential level of the block selection signal is VDD level.

3. The method of claim 1, wherein the second potential level is VSS level.

4. The method of claim 1, wherein the higher third potential level is VPP level.

* * * * *